United States Patent
Wilcoxen

(10) Patent No.: US 12,308,337 B1
(45) Date of Patent: May 20, 2025

(54) POWER SEMICONDUCTOR APPARATUS AND BONDING METHOD THEREOF

(71) Applicant: Diodes Incorporated, Plano, TX (US)

(72) Inventor: Duane Wilcoxen, Dallas, TX (US)

(73) Assignee: Diodes Incorporated, Plano, TX (US)

( * ) Notice: Subject to any disclaimer, the term of this patent is extended or adjusted under 35 U.S.C. 154(b) by 0 days.

(21) Appl. No.: 18/882,721

(22) Filed: Sep. 11, 2024

(51) Int. Cl.
  *H01L 23/00* (2006.01)
  *H01L 21/768* (2006.01)
  *H01L 21/02* (2006.01)

(52) U.S. Cl.
  CPC ........ *H01L 24/32* (2013.01); *H01L 21/76843* (2013.01); *H01L 21/76864* (2013.01); *H01L 24/95* (2013.01); *H01L 21/02282* (2013.01); *H01L 2224/32225* (2013.01); *H01L 2224/95091* (2013.01); *H01L 2924/07025* (2013.01)

(58) Field of Classification Search
  CPC ..... H01L 24/26–33; H01L 21/77–7813; H01L 24/83; H01L 24/93–94; H10D 89/015
  See application file for complete search history.

(56) References Cited

U.S. PATENT DOCUMENTS

| 8,159,825 B1 * | 4/2012 | Dotsenko | H01L 24/13 |
| | | | 174/262 |
| 2024/0063174 A1 * | 2/2024 | Guo | H01L 21/18 |

FOREIGN PATENT DOCUMENTS

| WO | WO-2016194917 A1 * | 12/2016 | ............ B32B 27/00 |
| WO | WO-2019130185 A1 * | 7/2019 | ............ C08F 265/00 |

OTHER PUBLICATIONS

Brewer Science, "PermaSOL 35 Material / Permanent Material", effective date May 23, 2023.
HD MicroSystems, "Process Guide HD-3007 Polyimide Adhesive", May 2009.
Ishida, Hiroyuki, et al., "Permanent Wafer Bonding and Temporary Wafer Bonding / De-Bonding Technology Using Temperature Resistant Polymers", Journal of Photopolymer Science and Technology, vol. 27, No. 2, pp. 173-176.
Lueck, Matthew, et al., "Temporary Wafer Bonding Materials and Processes", In Proc. of IMAPS International Conf. on Device Packaging, Mar. 1, 2012, 4 pages.
Zussman, M.P., et al., "Using Permanent and Temporary Polyimide Adhesives in 3D-TSV Processing to Avoid Thin Wafer Handling", Journal of Microelectronics and Electronic Packaging, 2010, pp. 214-219.

* cited by examiner

*Primary Examiner* — Evan G Clinton
(74) *Attorney, Agent, or Firm* — AP3 Law Firm PLLC; Li Li

(57) ABSTRACT

An apparatus includes a backside supporting layer having a first thickness, an adhesive layer over the backside supporting layer, a metal layer over the adhesive layer, wherein the metal layer functions as a backside connector, a semiconductor substrate layer over the metal layer, wherein the semiconductor substrate active layer has a second thickness, and a plurality of front side connectors, wherein active circuits in the semiconductor substrate layer over are electrically coupled between the plurality of front side connectors and the metal layer.

19 Claims, 7 Drawing Sheets

POWER SEMICONDUCTOR APPARATUS AND BONDING METHOD THEREOF

TECHNICAL FIELD

The present disclosure relates generally to the field of integrated circuits, and in particular embodiments, to techniques and mechanisms for a thin wafer power semiconductor apparatus.

BACKGROUND

Since the invention of the integrated circuit, the semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

As semiconductor technologies evolve, thin wafer semiconductor devices emerge as an effective alternative to further reduce the physical size of semiconductor chips. For example, thin wafer semiconductor devices are increasingly vital in battery applications where space is at a premium, such as in portable electronics and electric vehicles. These devices leverage ultra-thin silicon or other semiconductor materials to minimize thickness while maintaining high electrical performance. By reducing the wafer thickness, these semiconductors can be integrated into compact battery systems, enhancing energy density without compromising functionality.

In the semiconductor fabrication process, thin wafers present significant challenges due to their instability, lack of flatness, and susceptibility to breakage and stress during processing, all of which can negatively affect device quality. Unsupported thin wafers tend to have a non-planar, wavy profile, making them unsuitable for subsequent fabrication processes that require a flat surface. Additionally, when thin wafers are unsupported during the semiconductor assembly process, they can lead to severe package warpage. This occurs because the inherent stresses in the thin wafer, coupled with the support structure, may cause uneven distribution of forces during packaging. As the wafer is processed, these stresses can become imbalanced, particularly when the wafer is released from its support or subjected to thermal cycling during assembly. This imbalance can result in the entire package bending or warping, which can affect the reliability of the final product, leading to issues such as poor electrical connections, compromised mechanical stability, and reduced overall performance of the semiconductor device. Therefore, there is a clear need for a support assembly that can accommodate thin wafers within existing processing systems. The present disclosure addresses this need.

SUMMARY

Technical advantages are generally achieved, by embodiments of this disclosure which describe a thin wafer power semiconductor apparatus.

In accordance with an embodiment, a method comprises providing a device wafer having a first side bonded on a supporting wafer, wherein the device wafer comprises a metal layer, a semiconductor substrate, a dielectric layer and a plurality of connectors, providing a carrier, wherein a diameter of the carrier is the same as a diameter of the device wafer, coating an adhesive material onto a second side of the device wafer to form a first adhesive layer, coating the adhesive material onto the carrier to form a second adhesive layer, performing a partial curing process on the first adhesive layer and the second adhesive layer, bonding the device wafer to the carrier through bonding the first adhesive layer and the second adhesive layer together, and performing a full curing process on the adhesive material between the device wafer and the carrier.

In accordance with another embodiment, a device comprises a backside supporting layer having a first thickness, an adhesive layer over the backside supporting layer, a metal layer over the adhesive layer, wherein the metal layer functions as a backside connector, a semiconductor substrate layer over the metal layer, wherein the semiconductor substrate layer has a second thickness, and a plurality of front side connectors, wherein active circuits in the semiconductor substrate layer over are electrically coupled between the plurality of front side connectors and the metal layer.

In accordance with yet another embodiment, an apparatus comprises a backside supporting layer having a first thickness; an adhesive layer over the backside supporting layer, a metal layer over the cap layer, wherein the metal layer has a second thickness, and a semiconductor substrate layer over the metal layer, wherein the semiconductor substrate layer has a third thickness, wherein the first thickness of the backside supporting layer is at least four times greater than the third thickness of the semiconductor substrate layer, and the third thickness of the semiconductor substrate layer is greater than the second thickness of the metal layer.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments of this disclosure are discussed in detail below. It should be appreciated, however, that the concepts disclosed herein can be embodied in a wide variety of specific contexts, and that the specific embodiments discussed herein are merely illustrative and do not serve to limit the scope of the claims. Further, it should be understood that various changes, substitutions and alterations can be made herein without departing from the spirit and scope of this disclosure as defined by the appended claims.

Further, one or more features from one or more of the following described embodiments may be combined to create alternative embodiments not explicitly described, and features suitable for such combinations are understood to be within the scope of this disclosure. It is therefore intended that the appended claims encompass any such modifications or embodiments.

The present disclosure will be described with respect to embodiments in a specific context, namely a thin wafer power semiconductor apparatus. The disclosure may also be applied, however, to a variety of power devices. Hereinafter, various embodiments will be explained in detail with reference to the accompanying drawings.

Figure 1:
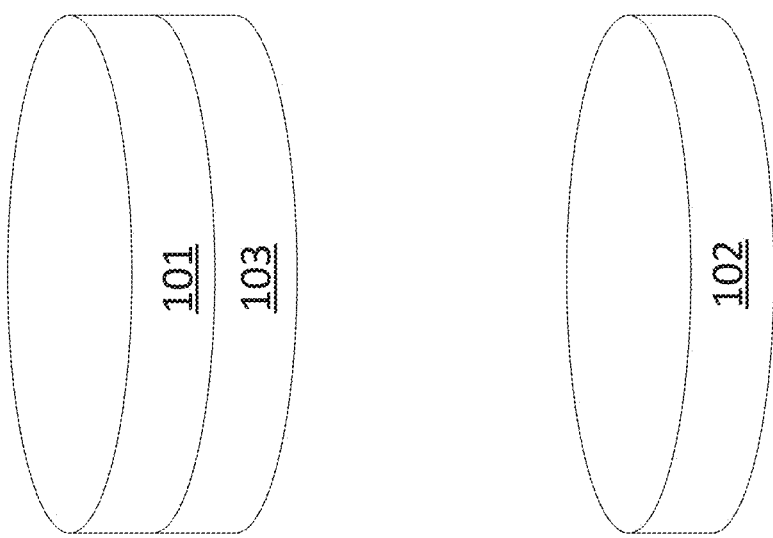
FIG. 1 illustrates a perspective view of a device wafer and a carrier in accordance with various embodiments of the present disclosure.

FIG. 1 illustrates a perspective view of a device wafer and a carrier in accordance with various embodiments of the present disclosure. The device wafer 101 is bonded on a supporting wafer 103. The device wafer 101 comprises a metal layer, a semiconductor substrate, a passivation layer and a plurality of connectors. In some embodiments, the passivation layer and the plurality of connectors are on a first side of the semiconductor substrate. The first side is also known as a front side of the semiconductor substrate. The metal layer is on a second side of the semiconductor substrate. The second side is also known as a backside of the semiconductor substrate. Depending on design needs and different application, a cap layer may be formed over the metal layer. The cap layer is formed of nickel. The metal layer is formed of copper. The nickel cap layer serves as a protective layer that ensures the functionality and longevity of the copper layer. Furthermore, a plurality of dielectric layers and interconnect structures are formed between the semiconductor substrate and the passivation layer. The interconnect structures provide the necessary electrical connections between different components or regions of the device wafer 101.

In some embodiments, the semiconductor substrate has been reduced to a thickness of about 50 micrometers (μm) through suitable semiconductor thinning processes such as a chemical mechanical planarization (CMP) process, a grinding process, an etch back process, any combinations thereof. The metal layer is of a thickness of about 30 μm. The total thickness of the device wafer 101 is about 80 μm. The supporting wafer 103 has a thickness that is greater than the thickness the device wafer 101. The supporting wafer 103 provides the necessary mechanical stability, allowing the device wafer 101 to withstand the rigors of various semiconductor processing steps.

The carrier 102 is formed of silicon. Alternatively, the carrier 102 is formed other suitable materials such as glass. In some embodiments, a diameter of the carrier 102 is the same as a diameter of the device wafer 101. The carrier 102 is free from active devices (e.g., transistors) and passive devices (e.g., capacitors, resistors, inductors). Furthermore, the carrier 102 may also be free from conductive lines such as metal lines.

In some embodiments, the device wafer 101 includes a plurality of device chips. The device wafer 101 shown in FIG. 1 is un-sawed, and includes the semiconductor substrate. The semiconductor substrate continuously extends throughout the device wafer 101. In accordance with some embodiments, the semiconductor substrate is formed of a crystalline silicon substrate. Alternatively, the semiconductor substrate may be formed of other semiconductor materials such as silicon germanium, silicon carbon and the like.

In accordance with some embodiments, the device wafer 101 comprises a plurality of active circuits. The active circuits are vertical power devices (e.g., vertical power MOSFET, diodes). The vertical power devices are connected between the metal layer and the plurality of connectors. Alternatively, the active circuits are lateral power devices (e.g., lateral power MOSFET, diodes). The active circuits are formed at the front side of the semiconductor substrate. Furthermore, the active circuits may be logic circuits (e.g., a central processing unit (CPU), graphics processing unit (GPU), system-on-a-chip (SoC), application processor (AP), microcontroller, etc.), memory circuits (e.g., dynamic random access memory (DRAM) dies, static random access memory (SRAM) dies, etc.), power management circuits (e.g., power management integrated circuit (PMIC) dies), radio frequency (RF) circuits, sensor circuits (e.g., image sensors), micro-electro-mechanical-system (MEMS) circuits, signal processing circuits (e.g., digital signal processing (DSP) dies), any combinations thereof and the like.

Figure 2:
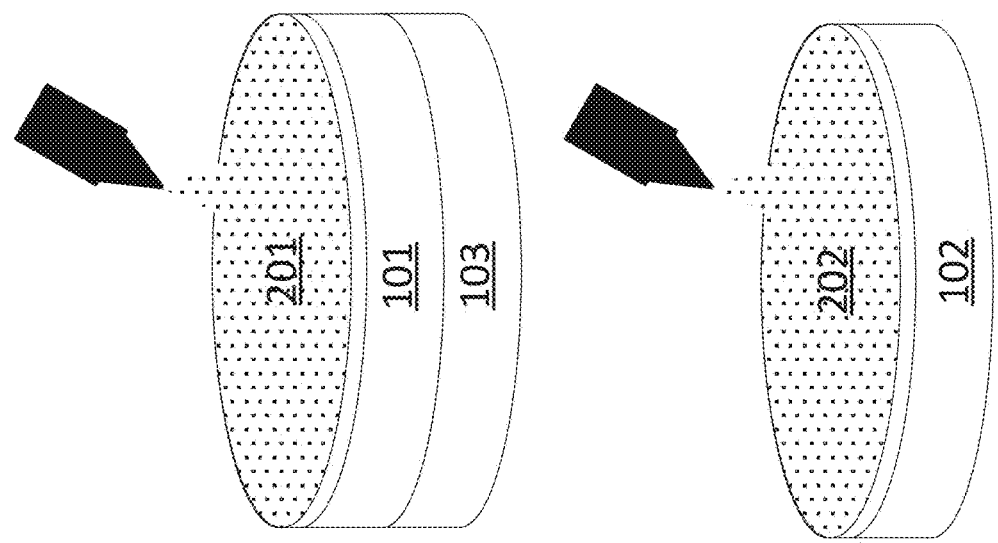
FIG. 2 illustrates a perspective view of the device wafer and the carrier after adhesive layers are formed on these two wafers in accordance with various embodiments of the present disclosure.

FIG. 2 illustrates a perspective view of the device wafer and the carrier after adhesive layers are formed on these two wafers in accordance with various embodiments of the present disclosure. Through a first spin coating process, an adhesive material is coated on the metal layer of the device wafer 101 to form a first adhesive layer 201. Once the first spin coating process finishes, the thickness of the first adhesive layer 201 is about 15.21 μm. Through a second spin coating process, the adhesive material is also coated on the carrier 102 to form a second adhesive layer 202. Once the second spin coating process finishes, the thickness of the second adhesive layer 202 is about 15.21 μm.

A soft bake process is applied to the first adhesive layer 201 and the second adhesive layer 202 after spin coating. The soft bake process is a thermal treatment process applied to remove residual solvent and improve the adhesion of the first adhesive layer 201 to the metal layer of the device wafer 101, and adhesion of the second adhesive layer 202 to the carrier 102. The specific conditions for the soft bake process can vary depending on design needs. In general, the soft bake process involves heating the coated device wafer and the coated carrier in an oven at a specific temperature for a set amount of time. In some embodiments, the temperature of the soft bake process is about 140 degrees. The soft bake time is about 5 minutes.

In some embodiments, the adhesive material is a polyimide adhesive material. The bonding temperature of the polyimide adhesive material is about 30 degrees. The polyimide adhesive material is in a semi-solid state when the temperature applied to the polyimide adhesive material is less than 160 degrees. The polyimide adhesive material is in a solid state after a full curing process. In some embodiments, the temperature of the full curing process is in a range from about 220 degrees to about 280 degrees. The full curing time is about 2 hours. The thickness of the adhesive layers may change after the full curing process is applied to the adhesive layers. In some embodiments, the thickness of the adhesive layers is about 15.21 μm. After the full curing process, the thickness of the adhesive layers is reduced to about 11.07 μm. The thickness shrinkage rate is about 27.26%.

Figure 3:
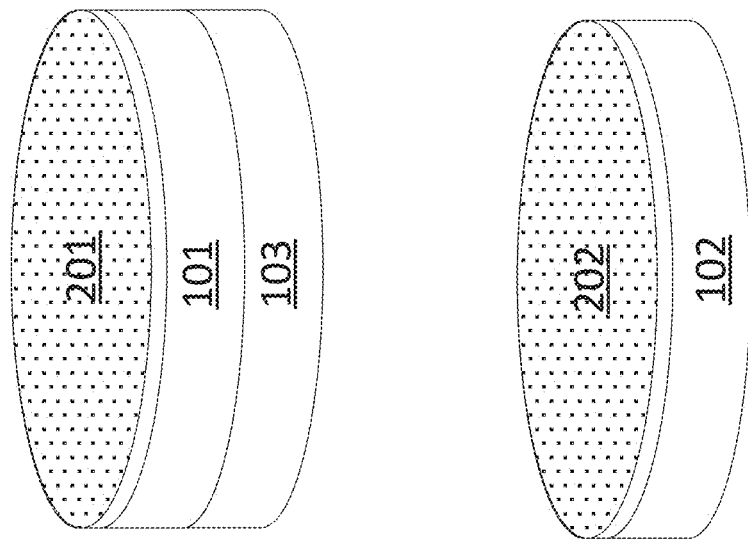
FIG. 3 illustrates a perspective view of the device wafer and the carrier when a partial curing process is applied to the adhesive layers in accordance with various embodiments of the present disclosure.

FIG. 3 illustrates a perspective view of the device wafer and the carrier when a partial curing process is applied to the adhesive layers in accordance with various embodiments of the present disclosure. The partial curing process is often used to reduce solvent and moisture content, which can enhance the adhesion and overall strength of the bond. This process typically involves applying heat to the adhesive material to drive off residual solvents and moisture. After the partial curing process, the adhesive material is in a semi-solid state. The material is subjected to higher temperatures to further reduce solvent content and eliminate moisture. This step also helps to cross-link the adhesive materials, enhancing their mechanical properties.

Figure 4:
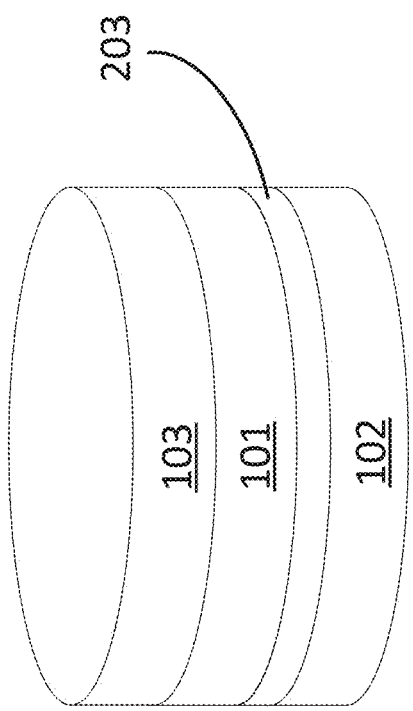
FIG. 4 illustrates a perspective view of the bonding of the carrier with the device wafer in accordance with various embodiments of the present disclosure.

FIG. 4 illustrates a perspective view of the bonding of the carrier with the device wafer in accordance with various embodiments of the present disclosure. In the process of bonding the device wafer 101 to the carrier 102, the adhesive material is in a liquid phase at the bonding temperature.

In operation, after the device wafer is flipped, the two wafers are aligned precisely and brought into contact with each other. The adhesive material flows to fill any gaps between the surfaces, ensuring a uniform bond. The stacked wafers are placed in a vacuum chamber to remove air and prevent void formation within the bond line. Once the vacuum is established, high pressure is applied to the device wafer 101 and the carrier 102. In some embodiments, the bonding pressure is about 1 millibar. Furthermore, a bonding force of 1,000 newtons is used to press the device wafer 101 and the carrier 102 together during the bonding process. The force is applied evenly across the surfaces of the device wafer 101 and the carrier 102 to ensure that the adhesive spreads uniformly, filling any gaps between the device wafer 101 and the carrier 102 to form an adhesive layer 203. This force is essential for ensuring a strong, uniform bond between the device wafer 101 and the carrier 102.

In some embodiments, the temperature of the bonding process is about 30 degrees. The bonding time is about 4 minutes.

Figure 5:
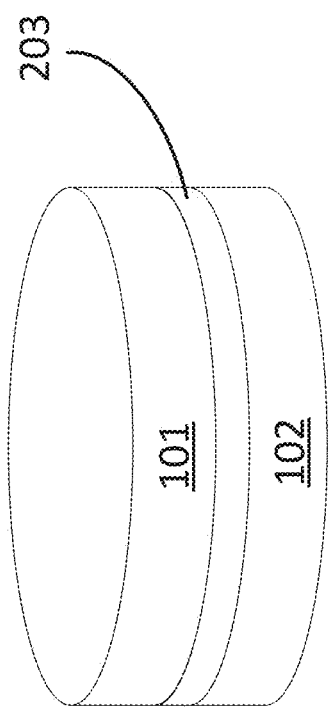
FIG. 5 illustrates a perspective view of the device wafer and the carrier after de-bonding the supporting wafer from the device wafer in accordance with various embodiments of the present disclosure.

FIG. 5 illustrates a perspective view of the device wafer and the carrier after de-bonding the supporting wafer from the device wafer in accordance with various embodiments of the present disclosure. The supporting wafer 103 is de-bonded from the device wafer 101. The wafer de-bonding can be accomplished using laser-release, solvent-release or thermal-release techniques.

As shown in FIG. 5, after de-bonding the supporting wafer 103 from the device wafer 101, the carrier 102 is left in the final structure.

A full curing process is applied to the adhesive layer 203. The curing process ensures that the adhesive fully polymerizes or cross-links, transitioning from a liquid or a semi-solid state to a solid state. This reaction strengthens the bond between the device wafer 101 and the carrier 102, increasing the mechanical integrity of the final structure. In some embodiments, the temperature of the full curing process is in a range from about 260 degrees to about 280 degrees. The full curing time is about 2 hours.

After a suitable singulation process (e.g., a sawing process), the final structure including the device wafer 101, the adhesive layer 203 and the carrier 102 is divided into many individual device chips, each of which represents a complete, functional unit that can be packaged and used in electronic devices.

Figure 6:
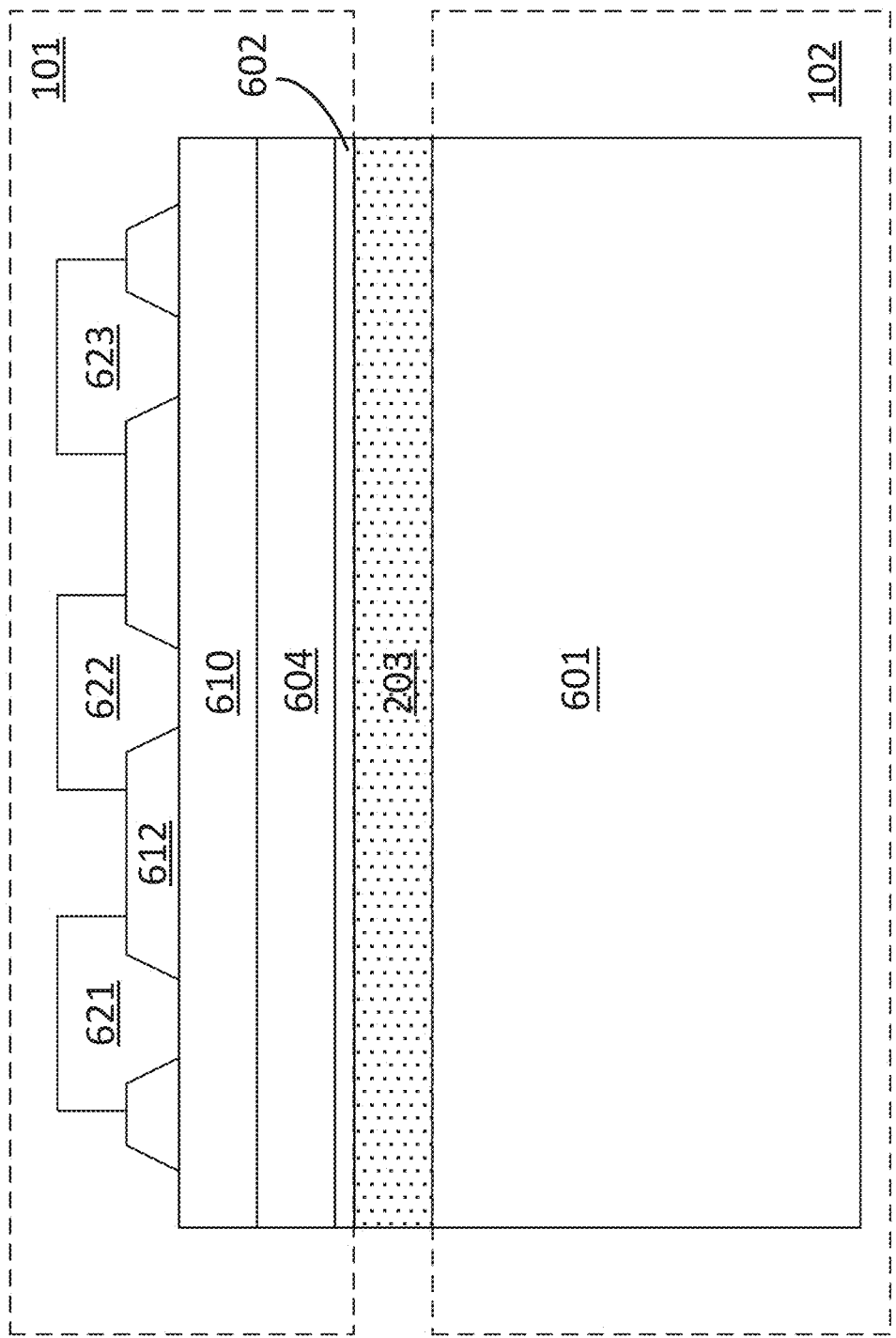
FIG. 6 is a cross-sectional view of a device chip in accordance with various embodiments of the present disclosure.

FIG. 6 is a cross-sectional view of a device chip in accordance with various embodiments of the present disclosure. The device chip comprises a backside supporting layer 601, an adhesive layer 203, a cap layer 602, a metal layer 604, the semiconductor substrate 610, a passivation layer 612 and a plurality of connectors 621, 622 and 623.

The backside supporting layer 601 shown in FIG. 6 is one piece of the carrier 102 shown in FIG. 5. As shown in FIG. 6, at a time after the singulation process has been performed, the piece of the carrier 102 is an outmost layer of a corresponding device chip.

The adhesive layer 203 is a dielectric layer formed of a polyimide adhesive material. This polyimide adhesive material has been described above with respect to FIG. 2, and hence is not discussed herein.

The cap layer 602 is formed of nickel. The cap layer serves as a protective layer that ensures the functionality and longevity of the metal layer 604.

The metal layer 604 is formed of copper. The metal layer 604 functions a backside connector electrically connected to the active circuits in the semiconductor substrate 610. In some embodiments, the active circuits in the semiconductor substrate 610 are a plurality of diodes. The metal layer 604 is electrically connected to cathodes or anodes of the plurality of diodes. In alternative embodiments, the active circuits in the semiconductor substrate 610 are a plurality of back-to-back connected transistors. The metal layer 604 is electrically connected to shared drains or shared sources of the plurality of back-to-back connected transistors.

The semiconductor substrate 610 may be silicon, doped or undoped, or an active layer of a semiconductor-on-insulator substrate. The semiconductor substrate 610 may include other semiconductor materials, such as germanium, silicon carbide, gallium arsenic, gallium phosphide, indium phosphide, indium arsenide, and/or indium antimonide, any combinations thereof and the like.

An inter-layer dielectric (ILD) layer (not shown) may be over the active surface of the semiconductor substrate 610. The ILD layer may include one or more dielectric layers formed of materials such as Phospho-Silicate Glass (PSG), Boro-Silicate Glass (BSG), Boron-Doped Phospho-Silicate Glass (BPSG), undoped Silicate Glass (USG) or the like. The dielectric material may be deposited by spinning, chemical vapor deposition (CVD) or plasma-enhanced CVD (PECVD) techniques.

A plurality of metallization layers (not shown) may be formed over the ILD layer. The metallization layers are used to interconnect various active circuits in the semiconductor substrate 610 and further provide electrical connections between the active circuits and external circuits (not shown).

The passivation layer 612 are formed over the semiconductor substrate 610. The passivation layer 612 may be formed of one or more suitable dielectric materials such as silicon oxide, silicon nitride, low-k dielectrics such as carbon doped oxides, extremely low-k dielectrics such as porous carbon doped silicon dioxide, a polymer such as polyimide, solder resist, polybenzoxazole (PBO), a benzocyclobutene (BCB) based polymer, molding compound, any combination thereof and the like. The passivation layer 612 may be formed by spin coating, lamination, CVD, any combinations thereof and the like.

The connectors 621, 622 and 623 are formed extending through the passivation layer 612 to physically and electrically couple to the semiconductor substrate 610. Alternatively, the connectors 621, 622 and 623 may be electrically coupled to the semiconductor substrate 610 through the interconnect structures in the metallization layers. The connectors 621, 622 and 623 are formed of a conductive material such as are aluminum, copper, tungsten, silver, gold, a combination thereof, and/or the like.

In some embodiments, the backside supporting layer 601 has a first thickness in a range from about 200 μm to about 725 μm. The metal layer 604 has a second thickness of about 30 μm. The semiconductor substrate 610 has a third thickness of about 50 μm.

In some embodiments, the total thickness of the device chip shown in FIG. 6 should be less than 200 μm. In order to achieve this thickness, a thinning process is performed on the backside supporting layer 601. The thinning process may be a mechanical grinding process, a chemical polishing process, an etching process or the like. By employing the thinning process, the backside supporting layer 601 can be ground so that the thickness of the backside supporting layer 601 may be reduced from about 725 μm to about 200 μm.

Figure 7:
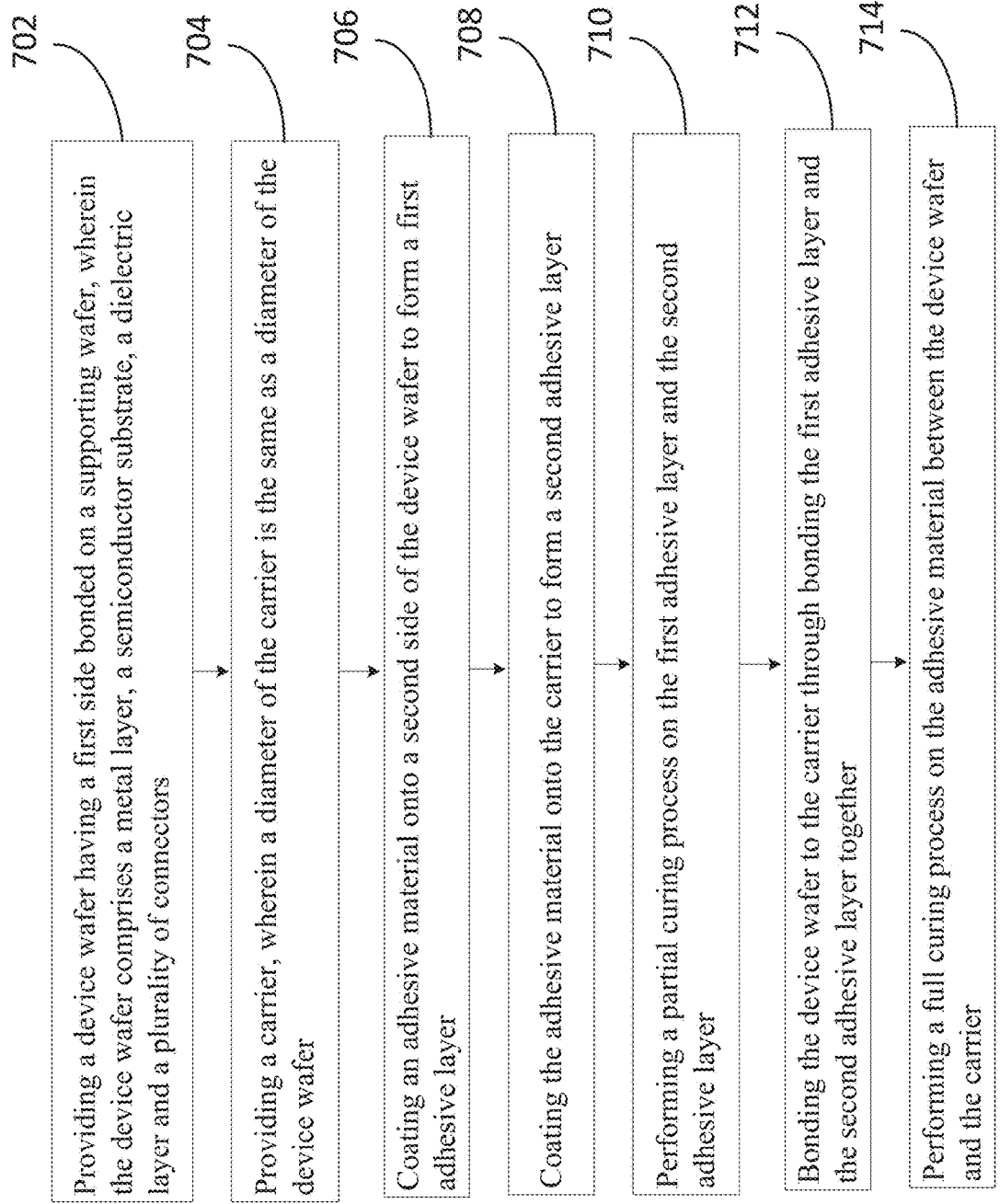
FIG. 7 illustrates a flow chart of a method for bonding a device wafer to a carrier in accordance with various embodiments of the present disclosure.

FIG. 7 illustrates a flow chart of a method for bonding a device wafer to a carrier in accordance with various embodiments of the present disclosure. This flowchart shown in FIG. 7 is merely an example, which should not unduly limit the scope of the claims. One of ordinary skill in the art would recognize many variations, alternatives, and modifications. For example, various steps illustrated in FIG. 7 may be added, removed, replaced, rearranged and repeated.

At step 702, a device wafer is provided. The device wafer has a first side bonded on a supporting wafer. The device wafer comprises a metal layer, a semiconductor substrate, a dielectric layer and a plurality of connectors.

At step 704, a carrier is provided. A diameter of the carrier is the same as a diameter of the device wafer.

At step 706, an adhesive material is coated onto a second side of the device wafer to form a first adhesive layer.

At step 708, the adhesive material is coated onto the carrier to form a second adhesive layer.

At step 710, a partial curing process is performed on the first adhesive layer and the second adhesive layer.

At step 712, the device wafer is bonded to the carrier.

At step 714, a full curing process is performed on the adhesive material between the device wafer and the carrier.

The method further comprises after bonding the device wafer to the carrier wafer and before performing the full curing process on the adhesive material, de-bonding the supporting wafer from the device wafer.

The method further comprises after performing the full curing process on the adhesive material, performing a singulation process to separate a plurality of chips in the device wafer into a plurality of packages, wherein each of the plurality of packages comprises a piece of the carrier.

At a time after the singulation process has been performed, the piece of the carrier is an outmost layer of a corresponding package.

The method further comprises at a first temperature, performing the partial curing process on the adhesive material over the second side of the device wafer and the carrier, at a second temperature, bonding the device wafer to the carrier, and at a third temperature, performing the full curing process on the adhesive material, wherein the third temperature is as least 100 degree higher than the first temperature, and the first temperature is as least 100 degree higher than the second temperature.

The first temperature is about 140 degrees, the second temperature is about 30 degrees, and the third temperature is about 260 degrees.

Before performing the full curing process on the adhesive material, an adhesive layer between the device wafer and the carrier has a first thickness. After performing the full curing process on the adhesive material, the adhesive layer between the device wafer and the carrier has a second thickness. The metal layer has a third thickness, and wherein the first thickness is greater than the third thickness, and the third thickness is greater than the second thickness.

The adhesive material is a polyimide adhesive material.

The metal layer is in direct contact with the semiconductor substrate, and the metal layer functions as a connector electrically coupled to active circuits in the semiconductor substrate.

The method further comprises bonding the device wafer to the carrier using liquid-phase bonding under high pressure in a vacuum.

Although the description has been described in detail, it should be understood that various changes, substitutions and alterations can be made without departing from the spirit and scope of this disclosure as defined by the appended claims. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, which may perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, or steps.

What is claimed is:

1. A method comprising:
   providing a device wafer having a first side bonded on a supporting wafer, wherein the device wafer comprises a metal layer, a semiconductor substrate, a dielectric layer and a plurality of connectors, wherein from a cross-section view, a length of the metal layer is equal to a length of the semiconductor substrate;
   providing a carrier, wherein a diameter of the carrier is the same as a diameter of the device wafer;
   coating an adhesive material onto a second side of the device wafer to form a first adhesive layer;
   coating the adhesive material onto the carrier to form a second adhesive layer;
   performing a partial curing process on the first adhesive layer and the second adhesive layer;

bonding the device wafer to the carrier through bonding the first adhesive layer and the second adhesive layer together; and performing a full curing process on the adhesive material between the device wafer and the carrier.

2. The method of claim 1, wherein:
after bonding the device wafer to the carrier wafer and before performing the full curing process on the adhesive material, de-bonding the supporting wafer from the device wafer.

3. The method of claim 1, further comprising:
after performing the full curing process on the adhesive material, performing a singulation process to separate a plurality of chips in the device wafer into a plurality of packages, wherein each of the plurality of packages comprises a piece of the carrier.

4. The method of claim 3, wherein:
at a time after the singulation process has been performed, the piece of the carrier is an outmost layer of a corresponding package.

5. The method of claim 1, further comprising:
at a first temperature, performing the partial curing process on the adhesive material over the second side of the device wafer and the carrier;
at a second temperature, bonding the device wafer to the carrier; and
at a third temperature, performing the full curing process on the adhesive material, wherein:
the third temperature is as least 100 degree higher than the first temperature; and
the first temperature is as least 100 degree higher than the second temperature.

6. The method of claim 5, wherein:
the first temperature is about 140 degrees;
the second temperature is about 30 degrees; and
the third temperature is about 260 degrees.

7. The method of claim 5, wherein:
before performing the full curing process on the adhesive material, an adhesive layer between the device wafer and the carrier has a first thickness;
after performing the full curing process on the adhesive material, the adhesive layer between the device wafer and the carrier has a second thickness; and
the metal layer has a third thickness, and wherein:
the first thickness is greater than the third thickness; and
the third thickness is greater than the second thickness.

8. The method of claim 1, wherein:
the adhesive material is a polyimide adhesive material.

9. The method of claim 1, wherein:
the metal layer is in direct contact with the semiconductor substrate; and
the metal layer functions as a connector electrically coupled to active circuits in the semiconductor substrate.

10. The method of claim 1, further comprising:
bonding the device wafer to the carrier using liquid-phase bonding under high pressure in a vacuum.

11. A method comprising:
providing a device wafer comprising:
a metal layer in direct contact with a semiconductor substrate, wherein from a cross-section view, a length of the metal layer is equal to a length of the semiconductor substrate; and
a dielectric layer overlaying the semiconductor substrate; and
bonding the device wafer to a carrier using an adhesive material through a multi-stage curing process.

12. The method of claim 11, wherein the metal layer serves as both:
a structural support for bonding processes; and
an electrical interface for active circuit connections.

13. The method of claim 11, wherein:
the adhesive material is a polymeric material capable of thermal curing; and
the adhesive material comprises a property of reducing thickness during curing to optimize adhesion and minimize thermal expansion mismatches.

14. The method of claim 11, wherein the multi-stage curing process includes:
a first stage for initial solidification of the bonding medium; and
a second stage for further curing to improve adhesion between the bonding medium and both the multi-layer device structure and the carrier substrate; and
a third stage for complete solidification and enhancement of the bonding properties.

15. The method of claim 11, further comprising:
adjusting a final thickness of the adhesive layer relative to the metal layer to achieve specific thermal and mechanical characteristics in a final device.

16. A method comprising:
applying a bonding medium to the conductive backside layer of a device wafer and a permanent carrier substrate;
forming a multi-layer device structure through uniting the device wafer with the permanent carrier substrate via the bonding medium; and
solidifying the bonding medium using a multi-stage curing process, wherein the multi-stage curing process includes:
a first stage for initial solidification of the bonding medium; and
a second stage for further curing to improve adhesion between the bonding medium and both the multi-layer device structure and the carrier substrate; and
a third stage for complete solidification and enhancement of the bonding properties.

17. The method of claim 16, wherein:
the bonding medium is applied in a uniform thickness to ensure consistent bonding strength between the device wafer and the carrier substrate.

18. The method of claim 16, wherein:
the multi-stage curing process is performed at different temperatures, with each stage involving a change in curing temperature to ensure optimal bond strength.

19. The method of claim 16, wherein:
the bonding medium is a polymeric material that undergoes chemical crosslinking during the curing process.

* * * * *

UNITED STATES PATENT AND TRADEMARK OFFICE
CERTIFICATE OF CORRECTION

PATENT NO. : 12,308,337 B1
APPLICATION NO. : 18/882721
DATED : May 20, 2025
INVENTOR(S) : Duane Wilcoxen It is certified that error appears in the above-identified patent and that said Letters Patent is hereby corrected as shown below:

On the Title Page

In item (57) the Abstract, Line 6, delete "active" after substrate;

In item (57) the Abstract, Line 8, delete "over" after layer;

In the Specification

Column 2, Line 18, delete "over" after layer;

Column 4, Line 6, add --of-- after thickness;

Column 4, Line 11, add --of-- after formed; and

Column 7, Line 21, delete "are" after as.

Signed and Sealed this
Thirtieth Day of September, 2025

John A. Squires
*Director of the United States Patent and Trademark Office*